United States Patent
Dhas et al.

(10) Patent No.: US 10,704,149 B2
(45) Date of Patent: Jul. 7, 2020

(54) DEFECT CONTROL AND STABILITY OF DC BIAS IN RF PLASMA-BASED SUBSTRATE PROCESSING SYSTEMS USING MOLECULAR REACTIVE PURGE GAS

(71) Applicant: LAM RESEARCH CORPORATION, Fremont, CA (US)

(72) Inventors: Arul Dhas, Sherwood, OR (US); Kareem Boumatar, Vancouver, WA (US); Christopher Ramsayer, Tualatin, OR (US)

(73) Assignee: Lam Research Corporation, Fremont, CA (US)

( * ) Notice: Subject to any disclaimer, the term of this patent is extended or adjusted under 35 U.S.C. 154(b) by 147 days.

(21) Appl. No.: 16/057,989

(22) Filed: Aug. 8, 2018

(65) Prior Publication Data

US 2018/0347046 A1 Dec. 6, 2018

Related U.S. Application Data

(60) Division of application No. 14/519,520, filed on Oct. 21, 2014, now Pat. No. 10,047,438, which is a
(Continued)

(51) Int. Cl.
*C23C 16/505* (2006.01)
*H01J 37/32* (2006.01)
(Continued)

(52) U.S. Cl.
CPC ........ *C23C 16/505* (2013.01); *C23C 16/4401* (2013.01); *C23C 16/458* (2013.01);
(Continued)

(58) Field of Classification Search
CPC ............... C23C 16/505; C23C 16/458; C23C 16/45525; C23C 16/4401; C23C 16/44;
(Continued)

(56) References Cited

U.S. PATENT DOCUMENTS

| 4,795,880 A | 1/1989 | Hayes et al. |
| 5,017,404 A | 5/1991 | Paquet et al. |

(Continued)

FOREIGN PATENT DOCUMENTS

| CN | 1957437 A | 5/2007 |
| CN | 102529203 A | 7/2012 |

(Continued)

OTHER PUBLICATIONS

Tedrow, "Plasma-Enhanced Chemical Vapor Deposition", Tedrow et al, ASM Handbook vol. 5—Surface Engineering, pp. 532-537, 1994 (Year: 1994).*

(Continued)

*Primary Examiner* — Michael P Wieczorek
*Assistant Examiner* — Michael G Miller

(57) ABSTRACT

A method for processing a substrate in a substrate processing system includes selectively delivering at least one of a precursor, a deposition carrier gas, and a post deposition purge gas to a processing chamber. The method includes depositing film on the substrate by generating radio frequency (RF) plasma in the processing chamber between an upper electrode and a lower electrode while supplying an RF voltage to one of the upper electrode and the lower electrode and while the precursor and the deposition carrier gas is delivered. The method includes selectively supplying a direct current (DC) bias voltage to the upper electrode or the lower electrode; moving the substrate relative to a pedestal supporting the substrate while generating the DC bias voltage; and delivering the post deposition purge gas while supplying at least a portion of the DC bias voltage to the upper electrode or the lower electrode.

13 Claims, 13 Drawing Sheets

Related U.S. Application Data continuation-in-part of application No. 14/300,854, filed on Jun. 10, 2014, now Pat. No. 10,081,869.

(51) Int. Cl.
*C23C 16/458* (2006.01)
*C23C 16/44* (2006.01)
*C23C 16/455* (2006.01)

(52) U.S. Cl.
CPC .... *C23C 16/45525* (2013.01); *H01J 37/3244* (2013.01); *H01J 37/32091* (2013.01); *H01J 37/32697* (2013.01); *H01J 37/32706* (2013.01); *Y10S 901/30* (2013.01)

(58) Field of Classification Search
CPC ........... H01J 37/32706; H01J 37/32697; H01J 37/3244; H01J 37/32091; Y10S 901/30; H01L 21/67011; H01L 21/67; H01L 21/205
USPC .............. 427/248.1–255.7, 569–579
See application file for complete search history.

(56) References Cited

U.S. PATENT DOCUMENTS

| | | | |
|---|---|---|---|
| 5,102,496 A | 4/1992 | Savas | |
| 5,242,561 A | 9/1993 | Sato | |
| 5,294,320 A | 3/1994 | Somekh et al. | |
| 5,298,103 A | 3/1994 | Steinberg et al. | |
| 5,321,634 A | 6/1994 | Obata et al. | |
| 5,401,356 A | 3/1995 | Enami et al. | |
| 5,449,432 A | 9/1995 | Hanawa | |
| 5,478,429 A | 12/1995 | Komino et al. | |
| 5,573,597 A * | 11/1996 | Lantsman | C23C 16/4401 118/723 E |
| 5,625,170 A | 4/1997 | Poris | |
| 5,672,242 A | 9/1997 | Jen | |
| 5,676,759 A | 10/1997 | Ye et al. | |
| 5,779,807 A | 7/1998 | Dornfest et al. | |
| 5,788,871 A | 8/1998 | Huh | |
| 5,788,877 A | 8/1998 | Shiflett | |
| 5,854,138 A | 12/1998 | Roth et al. | |
| 5,902,494 A * | 5/1999 | Gupta | C23C 16/4401 118/723 E |
| 5,919,531 A | 7/1999 | Arkles et al. | |
| 5,924,058 A | 7/1999 | Waldhauer et al. | |
| 6,089,181 A | 7/2000 | Suemasa et al. | |
| 6,139,923 A | 10/2000 | Gupta | |
| 6,184,489 B1 | 2/2001 | Ito et al. | |
| 6,194,234 B1 | 2/2001 | Huang et al. | |
| 6,214,160 B1 | 4/2001 | Dornfest et al. | |
| 6,237,527 B1 | 5/2001 | Kellerman et al. | |
| 6,245,189 B1 | 6/2001 | Rigali et al. | |
| 6,256,825 B1 | 7/2001 | Hwang | |
| 6,286,685 B1 | 9/2001 | Kononchuk et al. | |
| 6,290,821 B1 | 9/2001 | McLeod | |
| 6,352,049 B1 | 3/2002 | Yin et al. | |
| 6,365,009 B1 | 4/2002 | Ishibashi | |
| 6,375,860 B1 | 4/2002 | Ohkawa et al. | |
| 6,423,176 B1 | 7/2002 | Ito et al. | |
| 6,428,673 B1 | 8/2002 | Ritzdorf et al. | |
| 6,517,912 B1 | 2/2003 | Morfill et al. | |
| 6,616,987 B1 | 9/2003 | Morfill et al. | |
| 6,642,531 B1 | 11/2003 | Powers | |
| 6,708,559 B2 | 3/2004 | Chen et al. | |
| 6,709,522 B1 | 3/2004 | Condrashoff et al. | |
| 6,749,717 B1 | 6/2004 | Sandhu et al. | |
| 6,777,880 B2 | 8/2004 | Morfill et al. | |
| 6,790,376 B1 | 9/2004 | Markle et al. | |
| 6,793,832 B1 | 9/2004 | Saito et al. | |
| 6,808,592 B1 | 10/2004 | Rigali et al. | |
| 6,841,033 B2 | 1/2005 | Condrashoff et al. | |
| 6,843,858 B2 | 1/2005 | Rossman | |
| 6,893,532 B1 | 5/2005 | Sato et al. | |
| 6,902,620 B1 | 6/2005 | Omstead et al. | |
| 6,902,647 B2 | 6/2005 | Hasper | |
| 6,922,603 B1 | 7/2005 | Bailey, III | |
| 6,972,071 B1 | 12/2005 | Tyler | |
| 7,020,577 B2 | 3/2006 | Wilby | |
| 7,045,465 B2 | 5/2006 | Ito et al. | |
| 7,052,622 B2 | 5/2006 | Chinn et al. | |
| 7,102,763 B2 | 9/2006 | Ritzdorf et al. | |
| 7,152,461 B2 | 12/2006 | Temmler et al. | |
| 7,161,689 B2 | 1/2007 | Ritzdorf et al. | |
| 7,201,823 B2 | 4/2007 | Rigali et al. | |
| 7,335,601 B2 | 2/2008 | Han et al. | |
| 7,340,372 B2 | 3/2008 | Wilby | |
| 7,528,386 B2 | 5/2009 | Ruzic et al. | |
| 7,651,586 B2 | 1/2010 | Moriya et al. | |
| 7,659,212 B2 | 2/2010 | Tsuchiya et al. | |
| 7,728,252 B2 | 6/2010 | Morikawa et al. | |
| 7,799,138 B2 | 9/2010 | Fontejon, Jr. et al. | |
| 7,892,863 B2 | 2/2011 | Wilby et al. | |
| 7,967,913 B2 | 6/2011 | Hua et al. | |
| 8,052,798 B2 | 11/2011 | Moriya et al. | |
| 8,192,806 B1 | 6/2012 | Varadarajan et al. | |
| 8,200,353 B2 | 6/2012 | Wilby et al. | |
| 8,200,447 B2 | 6/2012 | Wilby et al. | |
| 8,202,394 B2 | 6/2012 | Moriya et al. | |
| 8,282,983 B1 | 10/2012 | Kapoor et al. | |
| 8,357,548 B2 | 1/2013 | Wilby | |
| 8,364,302 B2 | 1/2013 | Kiermasz | |
| 8,367,302 B2 | 2/2013 | Kim et al. | |
| 8,501,500 B2 | 8/2013 | Yang et al. | |
| 8,591,659 B1 | 11/2013 | Fang et al. | |
| 8,603,293 B2 | 12/2013 | Koshiishi et al. | |
| 8,608,422 B2 | 12/2013 | Moriya et al. | |
| 9,478,408 B2 | 10/2016 | Kang et al. | |
| 9,899,195 B2 | 2/2018 | Kang | |
| 2001/0025606 A1 | 10/2001 | Ichijo | |
| 2005/0133059 A1 | 6/2005 | Chen et al. | |
| 2006/0060303 A1 | 3/2006 | Fink et al. | |
| 2006/0066247 A1 | 3/2006 | Koshiishi et al. | |
| 2006/0191479 A1 | 8/2006 | Mizukami et al. | |
| 2008/0053817 A1 | 3/2008 | Koshimizu et al. | |
| 2008/0142481 A1 | 6/2008 | White et al. | |
| 2008/0182411 A1 | 7/2008 | Elers | |
| 2008/0302652 A1 | 12/2008 | Entley et al. | |
| 2009/0194508 A1 | 8/2009 | Ui et al. | |
| 2010/0055904 A1 | 3/2010 | Chen et al. | |
| 2010/0206098 A1 | 8/2010 | Wilby | |
| 2011/0011534 A1 | 1/2011 | Dhindsa | |
| 2011/0015773 A1 | 1/2011 | Wilby | |
| 2011/0160889 A1 | 6/2011 | Kuboi et al. | |
| 2011/0162674 A1 | 7/2011 | Tang et al. | |
| 2011/0272097 A1 | 11/2011 | Koshiishi et al. | |
| 2012/0107586 A1 | 5/2012 | Yu et al. | |
| 2012/0158169 A1 | 6/2012 | Finn et al. | |
| 2013/0118816 A1 | 5/2013 | Wilby | |
| 2013/0149800 A1 | 6/2013 | Kiermasz | |
| 2013/0260567 A1 | 10/2013 | Marakhtanov et al. | |
| 2014/0118751 A1 * | 5/2014 | Rajagopalan | C23C 16/5096 356/630 |
| 2014/0124138 A1 | 5/2014 | Gosselin | |
| 2015/0303054 A1 | 10/2015 | Hanashima et al. | |
| 2015/0354059 A1 | 12/2015 | Kang et al. | |
| 2015/0354061 A1 | 12/2015 | Dhas et al. | |
| 2015/0357161 A1 | 12/2015 | Augustyniak et al. | |
| 2017/0011893 A1 | 1/2017 | Kang et al. | |

FOREIGN PATENT DOCUMENTS

| | | |
|---|---|---|
| EP | 0697467 A1 | 2/1996 |
| JP | H11509979 A | 8/1999 |
| JP | 2008184688 A | 8/2008 |
| JP | 2009187975 A | 8/2009 |
| JP | 2012188701 A | 10/2012 |
| JP | 2013125761 A | 6/2013 |
| JP | 2013125796 A | 6/2013 |
| JP | 2013239574 A | 11/2013 |
| TW | 287293 B | 10/1996 |

(56) References Cited

FOREIGN PATENT DOCUMENTS

| WO | WO-2004095502 A2 | 11/2004 |
| WO | WO-2005119731 A2 | 12/2005 |
| WO | WO-2014080785 A1 | 5/2014 |

OTHER PUBLICATIONS

Notice of Reasons for Refusal for Japanese Patent Application No. 2015-116422 dated Jun. 25, 2019. English Comments provided.
First Taiwanese Office Action for Taiwan Application No. 104118566 dated Nov. 14, 2018. English translation provided by Jou and Jou Patent Offices.
First Chinese Office Action for Chinese Application No. CN201510316728.X dated Aug. 22, 2017. English comments from Sync Technology Law Group provided as translation of Office Action.

* cited by examiner

DEFECT CONTROL AND STABILITY OF DC BIAS IN RF PLASMA-BASED SUBSTRATE PROCESSING SYSTEMS USING MOLECULAR REACTIVE PURGE GAS

CROSS-REFERENCE TO RELATED APPLICATIONS

The present disclosure is a divisional of U.S. patent application Ser. No. 14/519,520 (now U.S. Pat. No. 10,047,438), filed on Oct. 21, 2014, which is a continuation-in-part of U.S. patent application Ser. No. 14/300,854 filed on Jun. 10, 2014. The entire disclosures of the applications referenced above are incorporated herein by reference.

FIELD

The present disclosure relates to substrate processing systems, and more particularly to defect control in substrate processing systems using RF plasma and reactive post deposition gas.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems for performing deposition and/or etching typically include a processing chamber with a pedestal. A substrate such as a semiconductor wafer may be arranged on the pedestal. For example in chemical vapor deposition (CVD) or atomic layer deposition (ALD) processes, a gas mixture including one or more precursors may be introduced into the processing chamber to deposit a film on the substrate or to etch the substrate.

In some substrate processing systems, radio frequency (RF) plasma may be used to activate chemical reactions. CVD and ALD systems using plasma are called plasma-enhanced CVD (PECVD) and plasma-enhanced ALD (PEALD). Some chemical reactions that happen in the gas phase lead to nucleation, clustering, and/or agglomeration of particles in a reactive volume of the RF plasma. The particles remain suspended in the RF plasma while the RF plasma is on. The particles do not fall onto the substrate due to a balance of forces acting upon the particles. For example, electrostatic repulsion suspends the particles in the RF plasma at a plasma boundary or plasma sheath.

After the RF excitation is turned off, the particles may fall onto the substrate. Therefore, most substrate processing systems evacuate the processing chamber by pumping residual gases for a predetermined period. During the predetermined period, the particles settle down in the processing chamber or are evacuated by the pump.

SUMMARY

A substrate processing system comprises an upper electrode and a lower electrode arranged in a processing chamber. A gas delivery system is configured to selectively deliver at least one of precursor, one or more deposition carrier gases and a post deposition purge gas. An RF generating system is configured to deposit film on the substrate by generating RF plasma in the processing chamber between the upper electrode and the lower electrode by supplying an RF voltage to one of the upper electrode and the lower electrode while the precursor and the one or more deposition carrier gases are delivered by the gas delivery system. A bias generating circuit is configured to selectively supply a DC bias voltage to one of the upper electrode and the lower electrode while the post deposition purge gas is delivered by the gas delivery system. The post deposition purge gas that is delivered by the gas delivery system includes a molecular reactant gas.

In other features, the post deposition purge gas does not include an inert gas. The post deposition purge gas is selected from one of the deposition carrier gases. The post deposition purge gas has a higher breakdown voltage than helium and argon over process pressures from 0.2 Torr to 6 Torr. A start of the DC bias voltage is initiated one of a first predetermined period before the RF plasma is extinguished and a second predetermined period after the RF plasma is extinguished.

In other features, a substrate movement system is configured to move the substrate relative to the pedestal while the DC bias voltage is generated. The substrate movement system includes a robot configured to move the substrate relative to the pedestal.

A substrate processing tool includes N reactors each including a plurality of the substrate processing systems, where N is an integer greater than zero. The substrate movement system includes an indexing mechanism configured to index substrates between the plurality of the substrate processing systems of at least one of the N reactors while the DC bias voltage is generated. The bias generating circuit generates the DC bias voltage before the RF plasma is extinguished and ends the DC bias voltage before a subsequent RF plasma is struck. The bias generating circuit generates the DC bias voltage continuously except during a period when the RF plasma is struck.

In other features, the RF generating system includes an RF generator to generate the RF voltages and a matching and distribution network in communication with the RF generator and the one of the upper electrode and the lower electrode. The film includes nitrogen-free anti-reflective film, the deposition carrier gases include carbon dioxide and helium, and the post deposition gas includes carbon dioxide. The film includes amorphous silicon, the one or more deposition carrier gases include molecular hydrogen and helium, and the post deposition purge gas includes molecular hydrogen. The film includes ashable hard mask, the one or more deposition carrier gases include molecular hydrogen and helium, and the post deposition purge gas includes molecular hydrogen. The film includes silicon nitride, the one or more deposition carrier gases include molecular nitrogen and ammonia, and the post deposition purge gas includes molecular nitrogen. The film includes silicon dioxide, the one or more deposition carrier gases include molecular nitrogen and nitrous oxide, and the post deposition purge gas includes molecular nitrogen. The film includes silicon oxycarbide, the one or more deposition carrier gases include carbon dioxide and helium, and the post deposition purge gas includes carbon dioxide.

A method for processing a substrate in a processing system includes selectively delivering at least one of precursor, one or more deposition carrier gases and post deposition purge gas to a processing chamber; depositing film on the substrate by generating RF plasma in the processing chamber between an upper electrode and a lower electrode while supplying an RF voltage to one of the upper electrode and the lower electrode and while the precursor and the one or more deposition carrier gases are delivered; and a bias generating circuit configured to selectively supply a DC bias voltage to one of the upper electrode and the lower electrode. The post deposition purge gas is delivered during at least a portion of the DC bias voltage. The post deposition purge gas includes a molecular reactant gas.

In other features, the post deposition purge gas does not include an inert gas. The post deposition purge gas is selected from one of the one or more deposition carrier gases. The post deposition purge gas has a higher breakdown voltage than helium and argon over process pressures from 0.2 Torr to 6 Torr. A start of the DC bias voltage is initiated one of a first predetermined period before the RF plasma is extinguished and a second predetermined period after the RF plasma is extinguished. A substrate movement system is configured to move the substrate relative to the pedestal while the DC bias voltage is generated.

In other features, the method includes indexing substrates while the DC bias voltage is generated. The method includes generating the DC bias voltage before the RF plasma is extinguished and ending the DC bias voltage before a subsequent RF plasma is struck. The method includes generating the DC bias voltage continuously except during a period when the RF plasma is struck.

In other features, the film includes nitrogen-free antireflective film, the one or more deposition carrier gases include carbon dioxide and helium, and the post deposition gas includes carbon dioxide. The film includes amorphous silicon, the one or more deposition carrier gases include molecular hydrogen and helium, and the post deposition purge gas includes molecular hydrogen. The film includes ashable hard mask, the one or more deposition carrier gases include molecular hydrogen and helium, and the post deposition purge gas includes molecular hydrogen. The film includes silicon nitride, the one or more deposition carrier gases include molecular nitrogen and ammonia, and the post deposition purge gas includes molecular nitrogen. The film includes silicon dioxide, the one or more deposition carrier gases include molecular nitrogen and nitrous oxide, and the post deposition purge gas includes molecular nitrogen. The film includes silicon oxycarbide, the one or more deposition carrier gases include carbon dioxide and helium, and the post deposition purge gas includes carbon dioxide.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

An RF plasma substrate processing system may apply a DC bias voltage to one of an upper electrode or a lower electrode in correlation with timing of the RF plasma. In some examples, the DC bias voltage is applied before the RF plasma is extinguished and is maintained until after the RF plasma is extinguished. In some examples, the DC bias voltage is applied after the RF plasma is extinguished. The DC bias voltage alters trajectories of the charged particles during evacuation of the processing chamber and reduces defect counts on substrates caused by the particles suspended in the RF plasma during extinction. While the DC bias voltage is applied to the upper electrode or the lower electrode, the substrate may be moved or indexed as required by the processing system.

The DC bias voltage creates an electrostatic field that keeps particles away from the substrate while the substrate is moved inside the tool. Inert noble gases such as helium and argon are typically used as the post deposition purge gas in PEALD and PECVD processes. However, processes that use helium and argon as post deposition purge gases are sensitive to the DC bias voltage due to formation of luminous discharge under typical process conditions (such as pressure, gas flow and voltage) in the processing chamber. As a result, the DC bias voltage that is used to reduce particle contamination is unstable with these post deposition purge gases and elevated defect performance occurs. The substrate processing systems according to the present disclosure utilize alternative post deposition purge gases that provide a stable DC bias voltage without any DC assisted plasma discharge and that reduce defects for substrate processing systems performing PECVD/PEALD deposition.

Figure 1A:
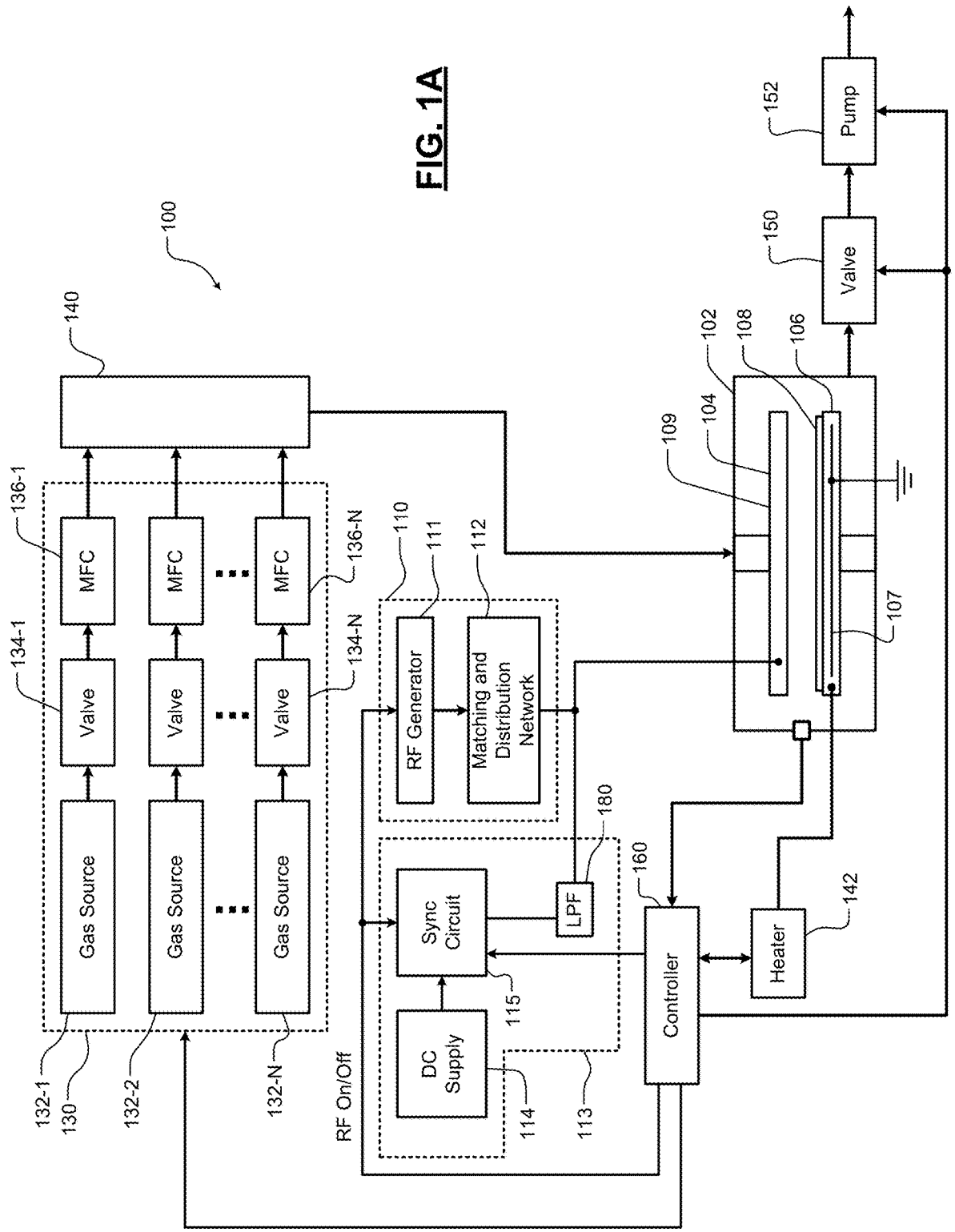
FIG. 1A is a functional block diagram of an example of a substrate processing system according to the present disclosure.

Referring now to FIG. 1A, an example of a substrate processing system 100 for performing deposition or etching using RF plasma is shown. For example, the substrate processing systems may be used to perform PEALD and PECVD. The substrate processing system 100 includes a processing chamber 102 that encloses other components of the substrate processing system 100 and contains the RF plasma. The substrate processing system 100 includes an upper electrode 104 and a pedestal 106 including a lower electrode 107. A substrate 108 is arranged on the pedestal 106 between the upper electrode 104 and the lower electrode 107.

For example only, the upper electrode 104 may include a showerhead 109 that introduces and distributes process gases. The showerhead 109 may include a stem portion including one end connected to a top surface of the processing chamber. A base portion is generally cylindrical and extends radially outwardly from an opposite end of the stem portion at a location that is spaced from the top surface of the processing chamber. A substrate-facing surface of the base portion of the showerhead includes a plurality of holes. Alternately, the upper electrode 104 may include a conducting plate and the process gases may be introduced in another manner. The lower electrode 107 may be arranged in a non-conductive pedestal. Alternately, the pedestal 106 may include an electrostatic chuck that includes a conductive plate that acts as the lower electrode 107.

An RF generating system 110 generates and outputs an RF voltage to one of the upper electrode 104 and the lower electrode 107. The other one of the upper electrode 104 and the lower electrode 107 may be DC grounded, AC grounded or floating. For example only, the RF generating system 110 may include an RF voltage generator 111 that generates the RF voltage that is fed by a matching and distribution network 112 to the upper electrode 104 or the lower electrode 107.

As will be described further below, a bias generating circuit 113 generates a DC bias voltage in response to on/off timing of the RF voltage and other timing parameters described below. In some examples, the bias generating circuit 113 may further include a DC voltage supply 114 that provides a DC voltage signal. The bias generating circuit 113 may further include a synchronization circuit 115 that switches on/off the DC voltage signal in response to the RF on/off signal. The synchronization circuit 115 determines the timing of the DC bias voltage based on the timing of the RF on/off signal. In some examples, the synchronization circuit 115 applies a delay to transitions of the RF on/off signal to determine a starting point of the DC bias voltage. Duration of the DC bias voltage may be set as well. In some examples, the DC bias voltage is applied to the electrode that receives the RF voltage to generate the RF plasma.

An example of a gas delivery system 130 is shown in FIG. 1A. A gas delivery system 130 includes one or more gas sources 132-1, 132-2, . . . , and 132-N (collectively gas sources 132), where N is an integer greater than zero. The gas sources supply one or more precursors and mixtures thereof. The gas sources may also supply purge gas. Vaporized precursor may also be used. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. An output of the manifold 140 is fed to the processing chamber 102. For example only, the output of the manifold 140 is fed to the showerhead 109.

A heater 142 may be connected to a heater coil (not shown) arranged in the pedestal 106. The heater 142 may be used to control a temperature of the pedestal 106 and the substrate 108. A valve 150 and pump 152 may be used to evacuate reactants from the processing chamber 102.

A controller 160 may be used to control components of the substrate processing system 100. The controller 160 sends the RF plasma on/off signals to the RF generating system 110 and the synchronization circuit 115. The controller 160 may also set timing parameters for the DC bias voltage such as time on and delay relative to a start or end of the RF plasma on/off signals.

For example only, the DC bias voltage may be a DC voltage having a magnitude of 100 to 600 volts and a positive or negative polarity. The DC bias voltage establishes an electrostatic field that alters trajectories of the charged particles suspended in the plasma when the RF plasma is turned off. The particles are still charged from immersion in the RF plasma after the RF plasma is turned off. At the same time, the processing chamber may be evacuated. The DC bias affected trajectories of the charged particles may bypass the substrate on their way to pumping ports and effectively protect the substrate from contamination.

Figure 1B:
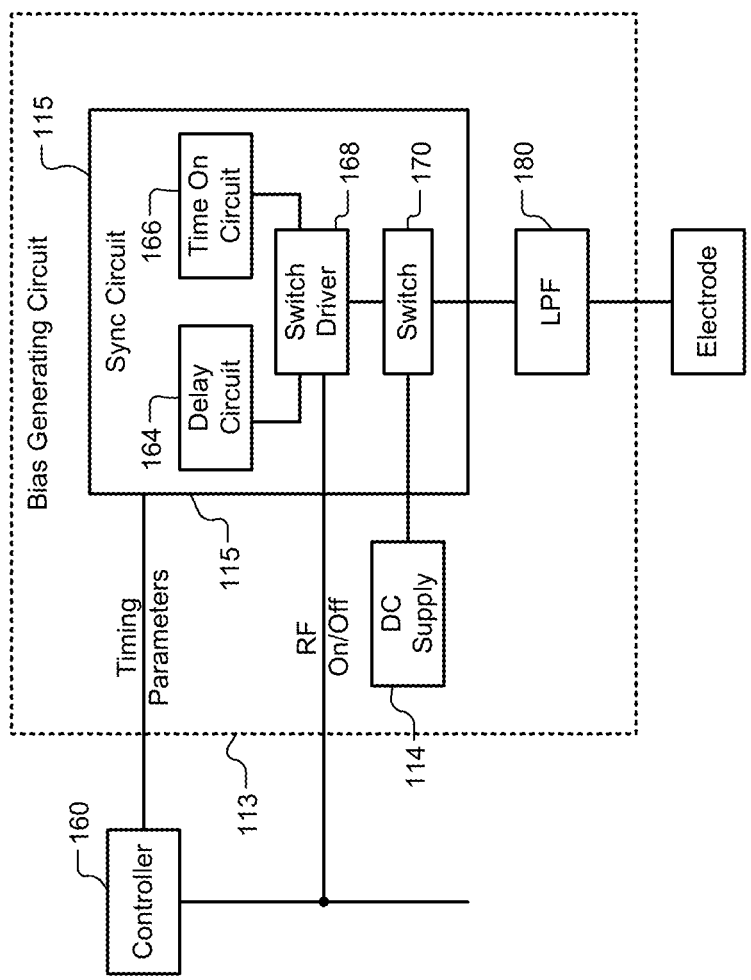
FIG. 1B is a functional block diagram of an example of a DC bias generating system according to the present disclosure.

Referring now to FIG. 1B, an example of the bias generating circuit 113 is shown. The bias generating circuit 113 includes a delay circuit 164 to store one or more delay times based on transitions of the RF plasma on/off signals. The bias generating circuit 113 includes a time on circuit 166 to store one or more durations of one or more DC bias voltages. Outputs of the delay circuit 164, the time on circuit 166 and the RF on/off signals are input to a switch driver 168, which generates switch drive signals to turn a switch 170 on and off as needed to provide the DC bias voltage. In some examples, an output of the synchronization circuit 115 is isolated from the RF voltage by an optional low pass filter (LPF) 180.

For example only, the switch driver 168 includes a trigger circuit that is enabled by a transition to RF on or RF off. Once triggered, the switch driver 168 waits a delay period that is set by the delay circuit 164. After the delay period, the switch driver 168 turns on the DC bias voltage by closing the switch 170 for a time on period that is set by the time on circuit 166. After the time on period, the switch driver 168 opens the switch 170 to turn off the DC bias voltage. As can be appreciated, the DC bias voltage can be triggered in any other suitable manner.

Figure 2:
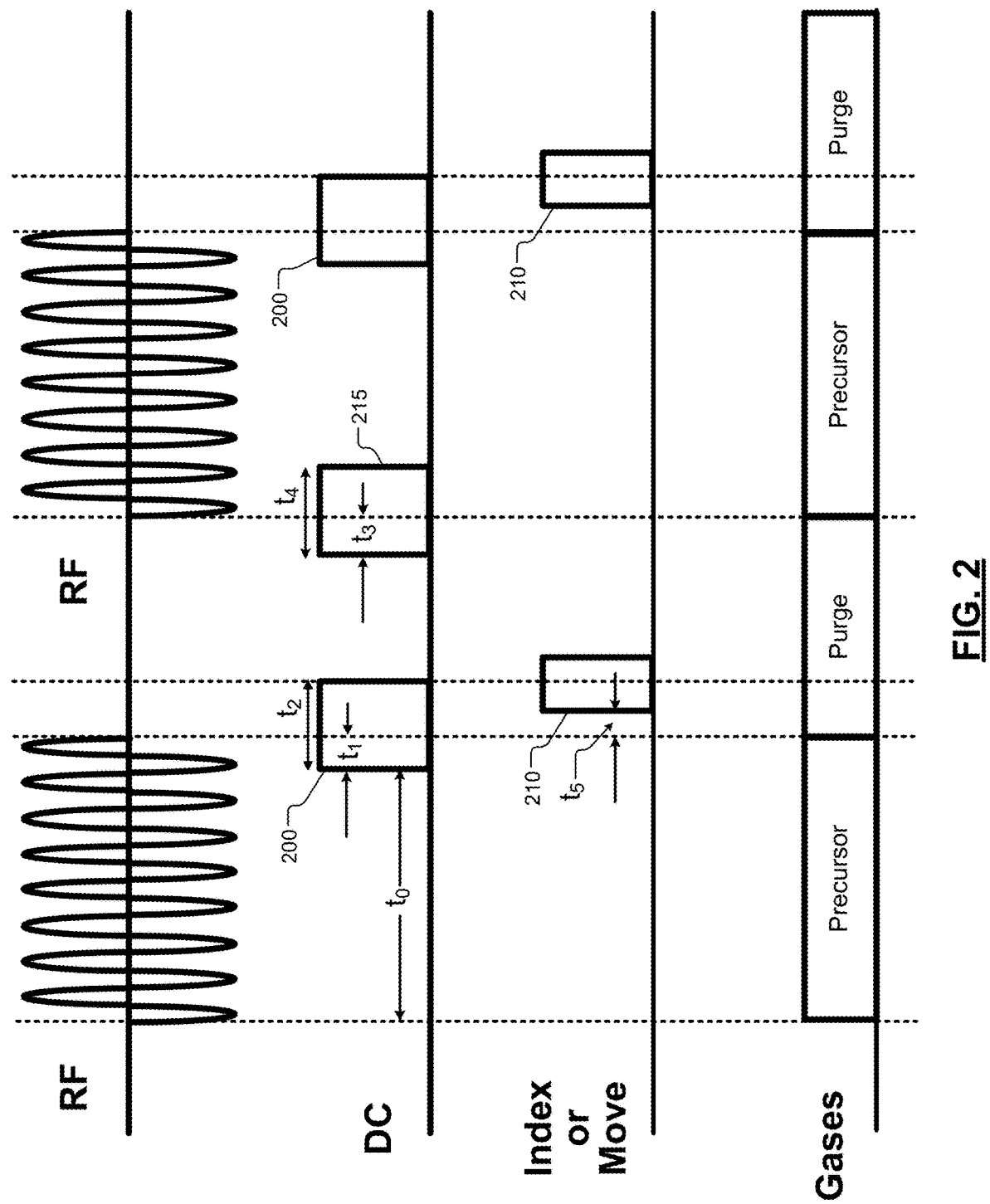
FIGS. 2 and 3 are timing diagrams illustrating examples of timing of a DC bias voltage relative to RF plasma signals, substrate indexing or movement signals and gas supply signals.
Figure 3:
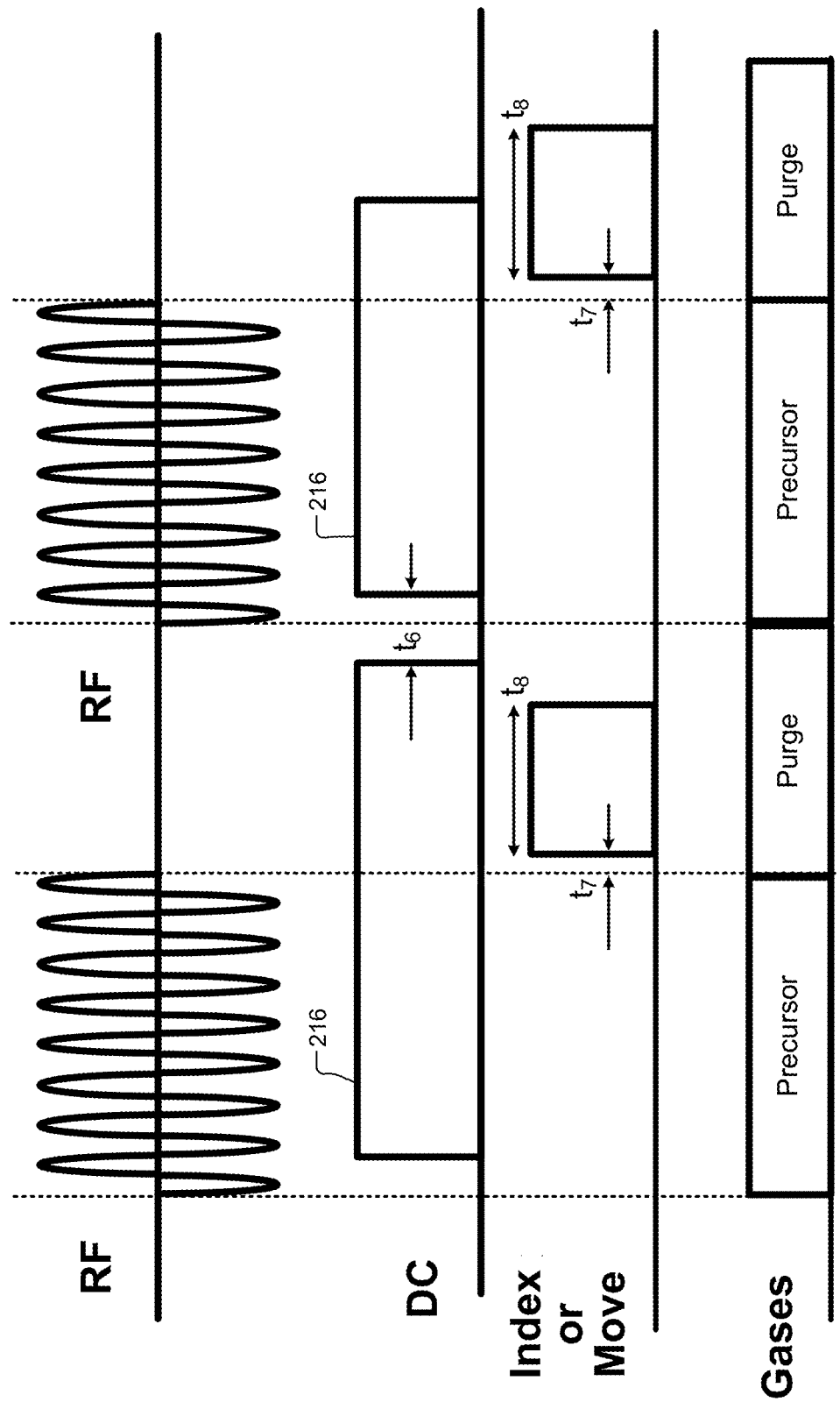

Referring now to FIGS. 2-3, examples of timing of various DC bias voltages are shown. In FIG. 2, an example of timing of the DC bias voltage is shown relative to the RF plasma signal, substrate index or movement signals, and gas supply signals. Typically, one or more gas or vapor precursors will be supplied while the RF plasma is on. Purge gas including molecular reactant gas (instead of atomic inert gas such as Argon or Helium) may be supplied when the RF plasma is off and/or when the DC bias is on as will be described further below.

In some examples, a DC bias voltage 200 is initiated before the RF plasma signal is terminated and continues until after the RF plasma signal is terminated. The timing of the DC bias voltage 200 may be based on a delay $t_0$ from a start of the RF voltage. The timing of the DC bias voltage 200 overlaps the RF voltage by a period $t_1$, has a duration $t_2$ and continues after the RF voltage ends for a period ($t_2-t_1$).

In some examples, the DC bias voltage is supplied while the substrate is being indexed or otherwise moved. More particularly, a substrate index or movement signal 210 may be generated in an overlapping manner during the DC bias voltage and after the RF voltage ends (for example, a period $t_5$ after the RF voltage ends). The indexing or movement may be complete before or after a falling edge of the DC bias voltage (such as the DC bias voltage 200).

In addition, another DC bias voltage 215 may be supplied before subsequent RF plasma is struck and end shortly after the RF plasma is struck. The DC bias voltage 215 in FIG. 2 precedes the RF voltage by $t_3$ and has a duration $t_4$.

In FIG. 3, the DC bias voltage may also be supplied at other times during substrate processing. For example, a DC bias voltage 216 in FIG. 3 may be supplied continuously except for a period $t_6$ when the RF plasma is struck. For illustration purposes, the index or move signal is delayed by a period $t_7$ and has a longer duration $t_8$ as compared to the index or move signal from FIG. 2.

In the examples in FIGS. 1A-3, the DC bias voltage is supplied to the upper electrode 104. In this example, the DC bias voltage may be a positive DC voltage or a negative DC voltage. The voltage polarity is selected by experimentation and may depend on the architecture of the processing system (design and dimensions) and processing conditions. As can be appreciated, the DC bias voltage can be supplied to the lower electrode 107 instead of the upper electrode. The DC bias voltage may be supplied to the same electrode as the RF voltages or to a different electrode provided that the different electrode is not grounded.

Figure 4A:
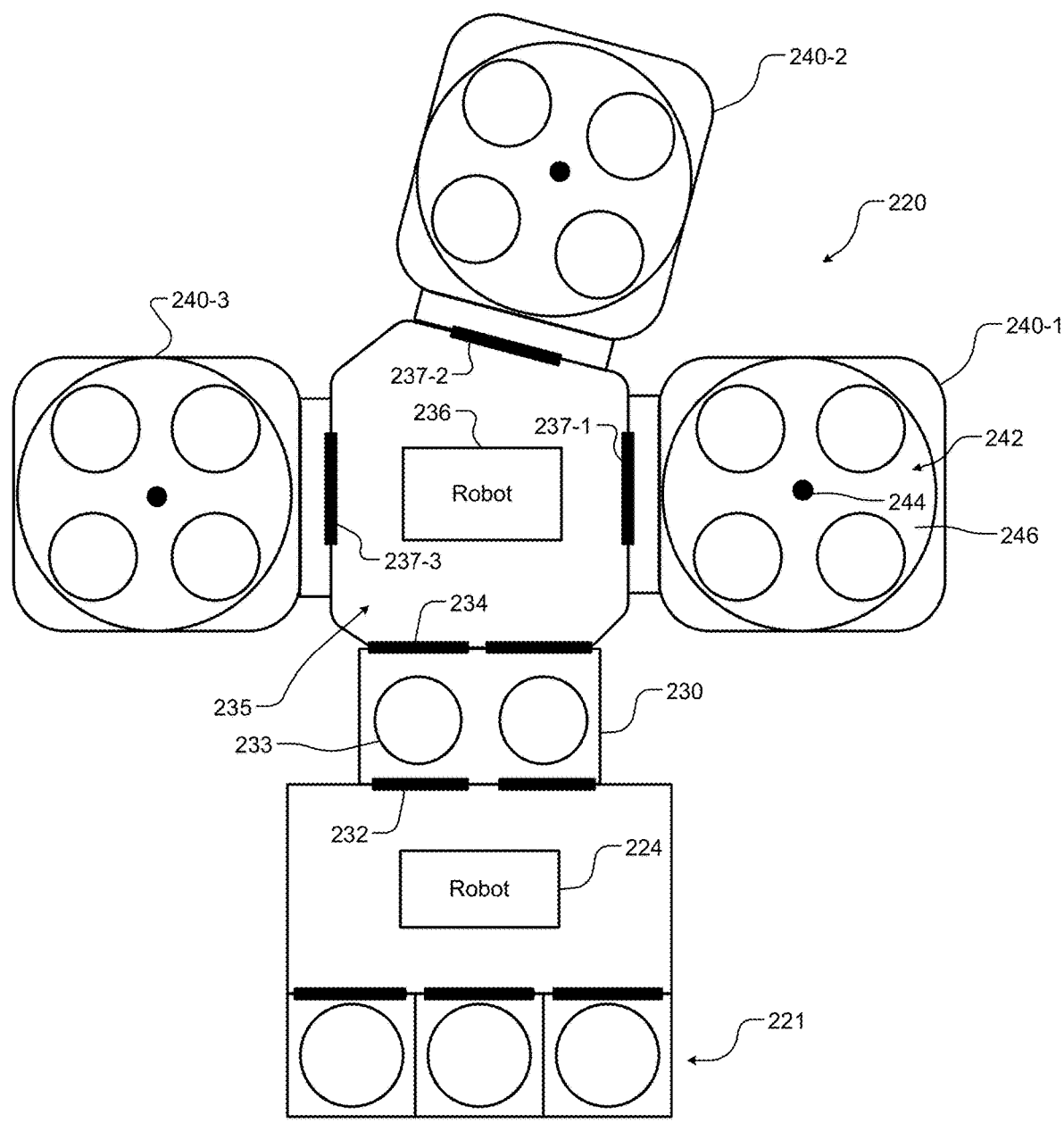
FIGS. 4A-4B and 5 illustrate examples of substrate processing tools.

Referring now to FIG. 4A, the substrate processing system 100 may be implemented in a tool 220 including multiple reactors each with multiple substrate processing systems. A substrate enters the tool 220 from a cassette loaded through a pod 221, such as the front opening unified pod (FOUP). A robot 224 includes one or more end effectors to handle the substrates. A pressure of the robot 224 is typically at atmospheric pressure. The robot 224 moves the substrates from the cassette to a load lock 230. For example, the substrate enters the load lock 230 through a port 232 and is placed on a load lock pedestal 233. The port 232 to the atmospheric environment closes and the load lock 230 is pumped down to an appropriate pressure for transfer. Then a port 234 opens and another robot 236 (also with one or more end effectors) places the substrates through one of the ports 237-1, 237-2, 237-3 (collectively ports 237) corresponding to a selected reactor 240-1, 240-2, and 240-3 (collectively reactors 240).

A substrate indexing mechanism 242 may be used to further position the substrates relative to the substrate processing chambers. In some examples, the indexing mechanism 242 includes a spindle 244 and transfer plates 246.

At least some of the stations of the reactors 240 correspond to the substrate processing system 100. The substrate processing systems 100 of the reactors 240 are capable of performing semiconductor processing operations, such as a material deposition or etch, sequentially or simultaneously with the other stations. At least some (and often all) of the stations perform RF-based semiconductor processing operations. The substrate is moved from one station to the next in the reactor 240 using the substrate indexing mechanism 242. One or more of the stations of the reactors 240 may be capable of performing RF plasma deposition or etching. During use, the substrates are moved to the reactors 240, processed and then returned to the pods 221. As can be appreciated, reducing the handling time of each substrate improves productivity and throughput.

Figure 4B:
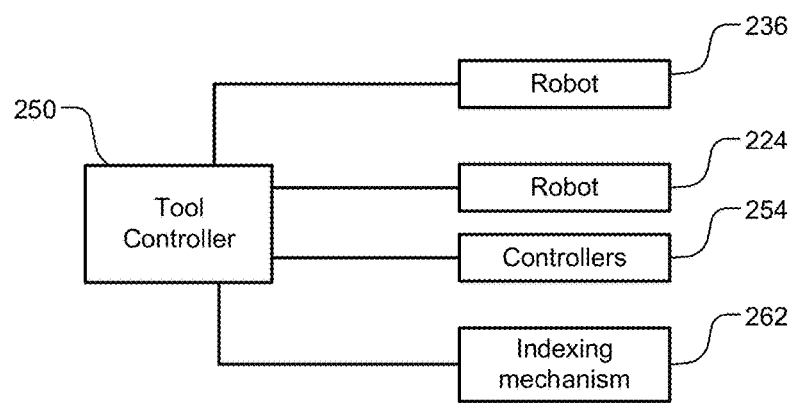

Referring now to FIG. 4B, a tool controller 250 may communicate with one or more controllers 254 that are associated with each of the stations of the reactors 240. Alternately, the tool controller 250 and the controllers 254 may be combined. The tool controller 250 also communicates with robots 224 and 236 and indexing mechanism controllers 262 to coordinate movement of the substrates and indexing of the substrates in each of the reactors 240.

Figure 5:
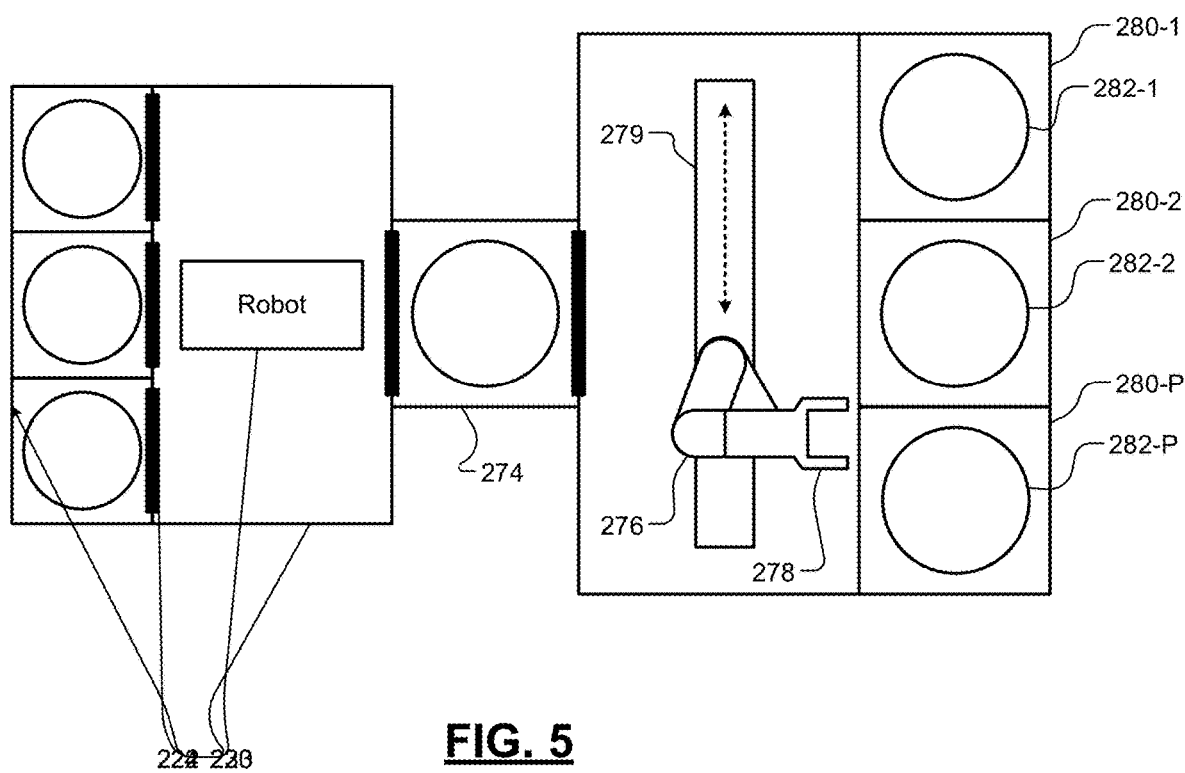

Referring now to FIG. 5, movement of the substrates may also be performed exclusively by a robot rather than robots and an indexing mechanism. Substrates are delivered to one port of a transfer chamber 274. The transfer chamber 274 pumps pressure therein to an appropriate level. Then, another port to the transfer chamber 274 opens and a robot 276 with one or more end effectors 278 delivers the substrate to a selected one of a plurality of processing chambers 280-1, 280-2, . . . , and 280-P (collectively processing chambers 280), where P is an integer greater than one. The robot 276 may move along a track 279. The robot 276 delivers the substrate onto one of a plurality of pedestals 282-1, 282-2, . . . , and 282-P corresponding to the selected one of the processing chambers 280.

Figure 6A:
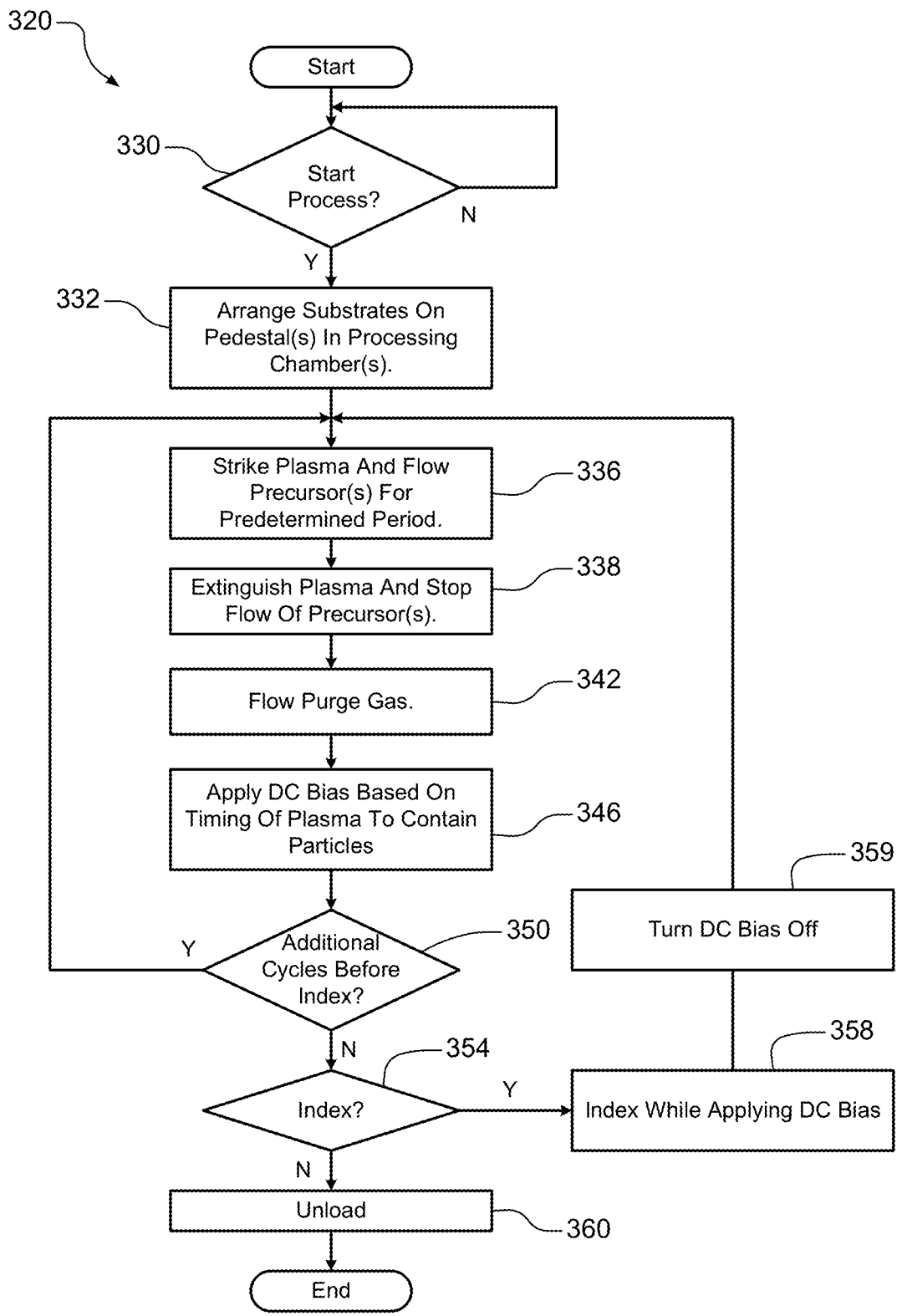
FIGS. 6A and 6B illustrates examples of methods for operating the substrate processing system according to the present disclosure.

Referring now to FIG. 6A, an example of a method 320 is shown. At 330, control determines whether the process has started. If true, control continues with 332 and arranges one or more substrates on one or more pedestals associated with one or more processing chambers. At 336, control strikes RF plasma in one or more of the processing chambers and flows precursor for a predetermined period. At 338, control extinguishes the RF plasma and stops the flow of precursors. At 342, control flows purge gas that includes molecular reactant gas rather than atomic inert gas. At 346, control supplies a DC bias voltage for a predetermined bias period after the RF plasma is extinguished. In some examples, the predetermined bias period ends before the next RF plasma is struck.

At 350, control determines whether there are additional RF plasma cycles before indexing or other substrate movement occurs. If true, control returns to 336. Otherwise, control determines whether indexing or other movement is needed. If 354 is true, control continues with 358 and indexes or otherwise moves the substrates during the bias period, turns off the DC bias at 359 and then returns to 336. Otherwise, control continues with 360 and unloads the substrates.

Figure 6B:
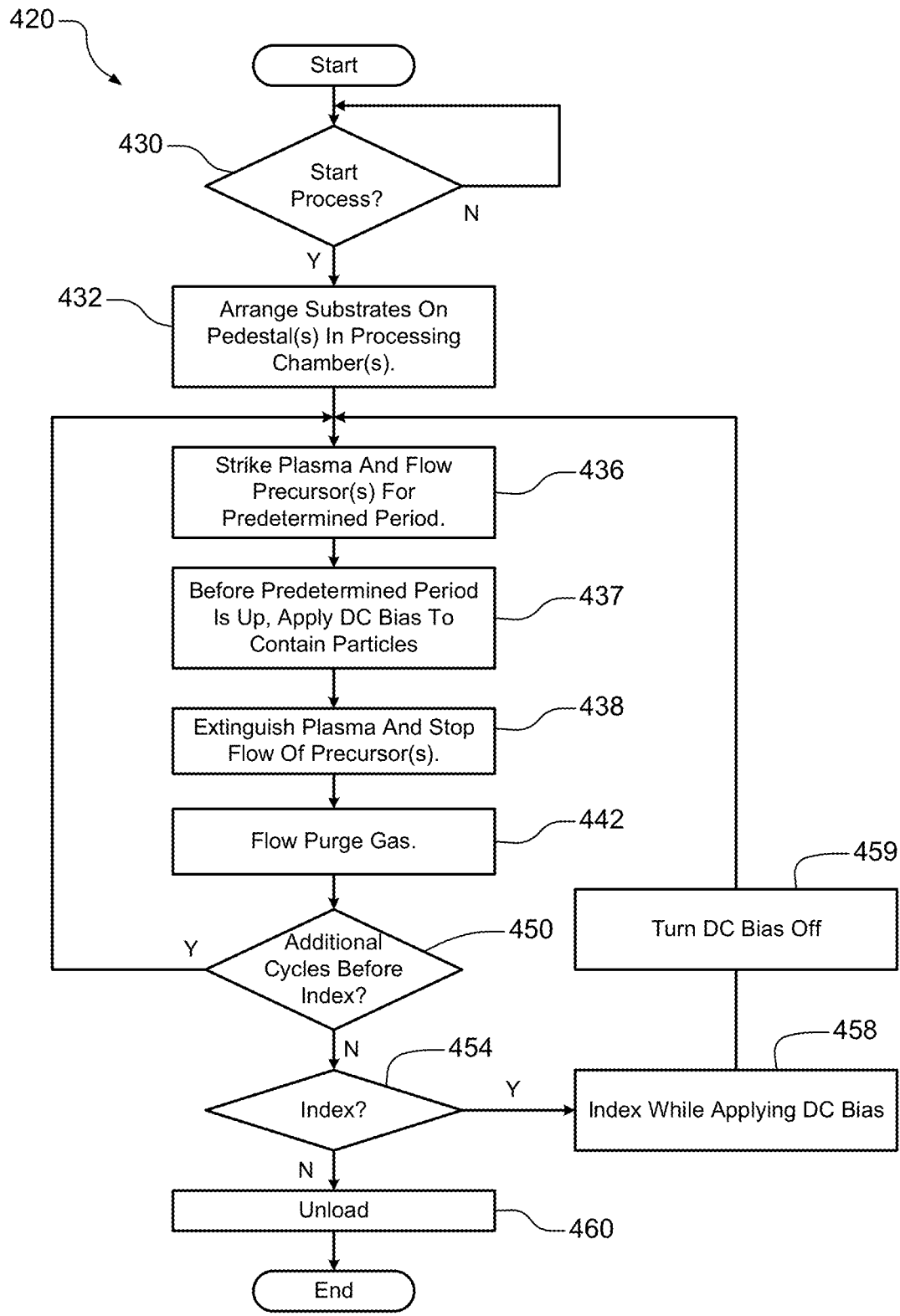

Referring now to FIG. 6B, an example of a method 420 is shown. At 430, control determines whether the process has started. If true, control continues with 432 and arranges one or more substrates on one or more pedestals associated with one or more processing chambers. At 436, control strikes plasma in one or more of the processing chambers and flows precursor for a first predetermined period. At 437, control supplies a DC bias voltage for a predetermined bias period starting before the first predetermined period is up (and the RF plasma is extinguished). In some examples, the predetermined bias period ends before a subsequent RF plasma is struck. At 438, control extinguishes the RF plasma and stops the flow of precursors. At 442, control flows purge gas that includes molecular reactant gas instead of atomic inert gas. At 450, control determines whether there are additional RF plasma cycles before indexing or other substrate movement occurs. If true, control returns to 436. Otherwise, control determines whether indexing or other movement is needed. If 454 is true, control continues with 458 and indexes or otherwise moves the substrates, turns off the DC bias at 459 and then returns to 436. Otherwise, control continues with 460 and unloads the substrates.

Figure 7:
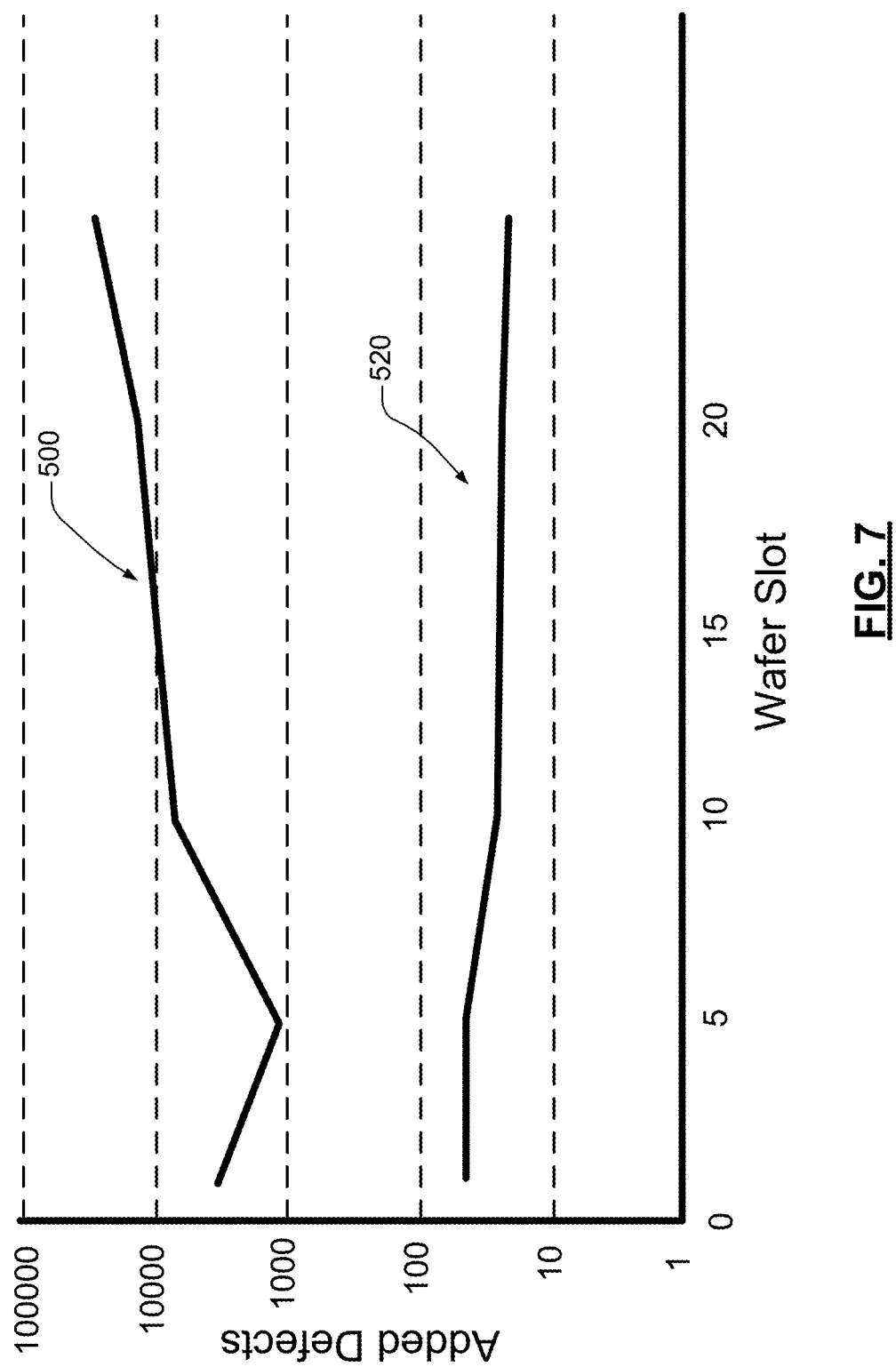
FIG. 7 illustrates defect counts for substrates that were processed with and without the DC bias voltage.

Referring now to FIG. 7, the number of defects on the substrate is reduced by supplying the DC bias and using purge gas including molecular reactant gas rather than atomic inert gas. The number of defects for a process is shown at 500 when the DC bias voltage is not supplied during substrate movement and at 520 when the DC bias voltage is supplied during substrate movement. DC bias voltage applied during substrate movement eliminates unproductive waiting time that is usually necessary to pump out residual gases and settle gas phase particles before movement takes place.

The present disclosure further reduces substrate defects by using DC bias voltage injection with purge gases that are compatible with the film/film deposition process. Inert noble gases such as helium (He) and argon (Ar) are typically used as a chamber purge gas in PECVD/PEALD systems. In the case of $N_2$ free films such as nitrogen-free anti-reflection layer (NFARL), amorphous silicon (a-Si), and ashable hard mask (AHM) films, the DC bias voltage tends to be unstable when inert gases such as He and Ar are used as the purge gas. When He and Ar are used as the purge gas, a DC-assisted plasma discharge occurs, which causes high defects.

Figure 8:
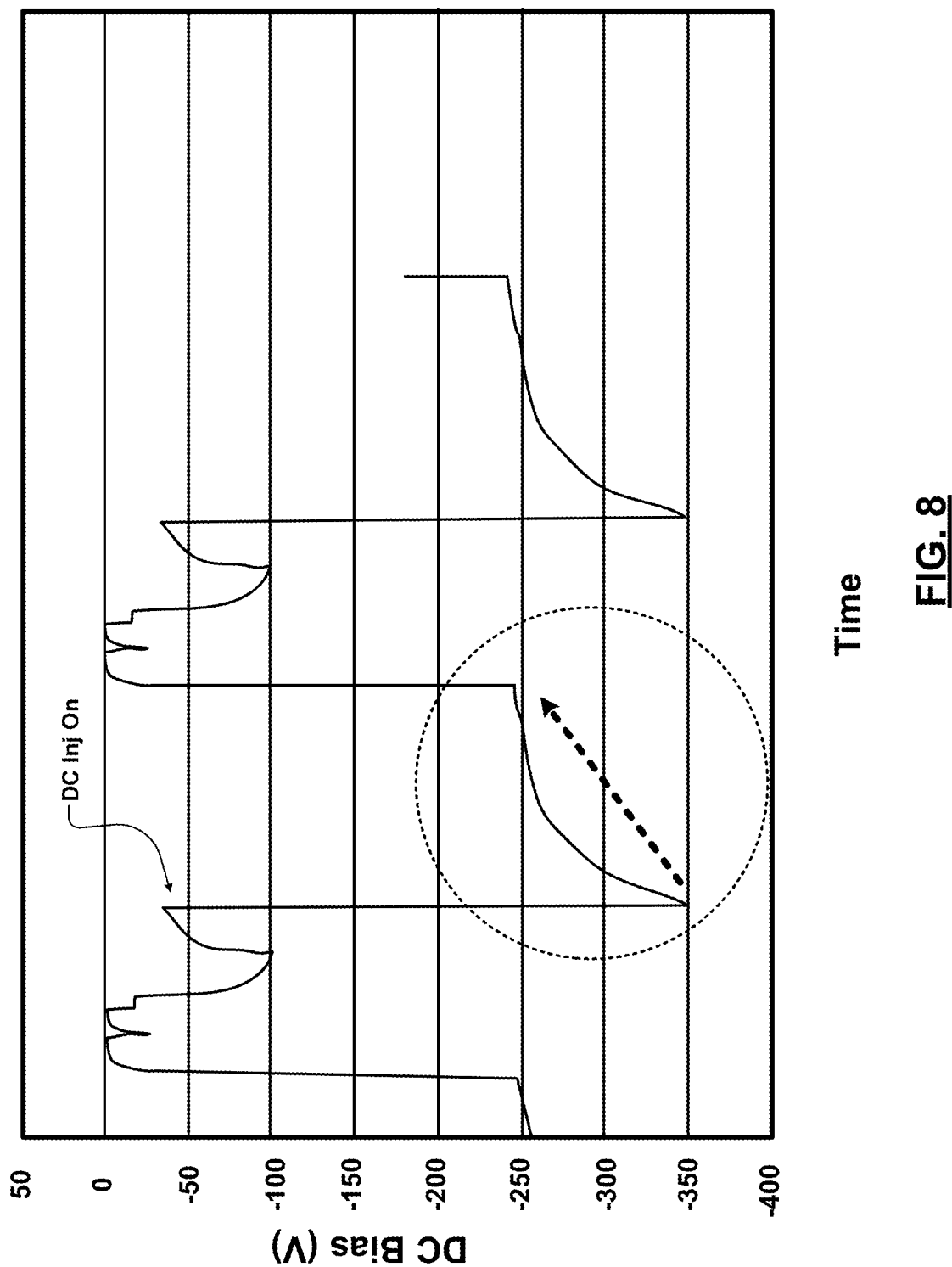
FIG. 8 is a graph illustrating DC bias voltage as a function of time for substrate processing systems depositing NFARL using helium as the post deposition purge gas.

Referring now to FIG. 8, an example of DC bias voltage behavior is shown with He as the post deposition purge gas for the NFARL film deposition process. As soon as the DC injection is supplied (in this example, −350 V), the DC bias voltage reaches a maximum negative voltage value and then gradually drops in magnitude. Without being limited to a particular theory, the drop in magnitude may be a result of a voltage division formed between resistive elements of the electrode system and the resistance of the plasma. The DC loss is also supported by the appearance of DC powered plasma glow between the electrodes. When argon is substituted for helium, a similar result occurs.

Without being limited to a particular theory, the likely mechanism for the plasma discharge with the DC bias voltage and the noble gases (such as He, Ar, etc.) is that these inert atomic gases have a low break down voltage, which is favorable for plasma glow under the typical process conditions. The plasma glow is typically enhanced by the long-lived, high energy species of inert noble gases generated by the DC excitation. The presence of uncontrolled DC plasma between the upper and lower electrodes leads to elevated defects. Furthermore, the hole pattern of the showerhead may be seen in the defects that appear on the substrate.

To reduce the uncontrolled DC plasma during the DC bias, the inert noble atomic purge gas is replaced by molecular reactant gas. For example only, some NFARL processes use both helium and $CO_2$ as deposition gases. In some examples, carbon dioxide ($CO_2$) may also be used as a post deposition purge gas instead of He to improve the DC bias voltage stability and to reduce defects.

Figure 9:
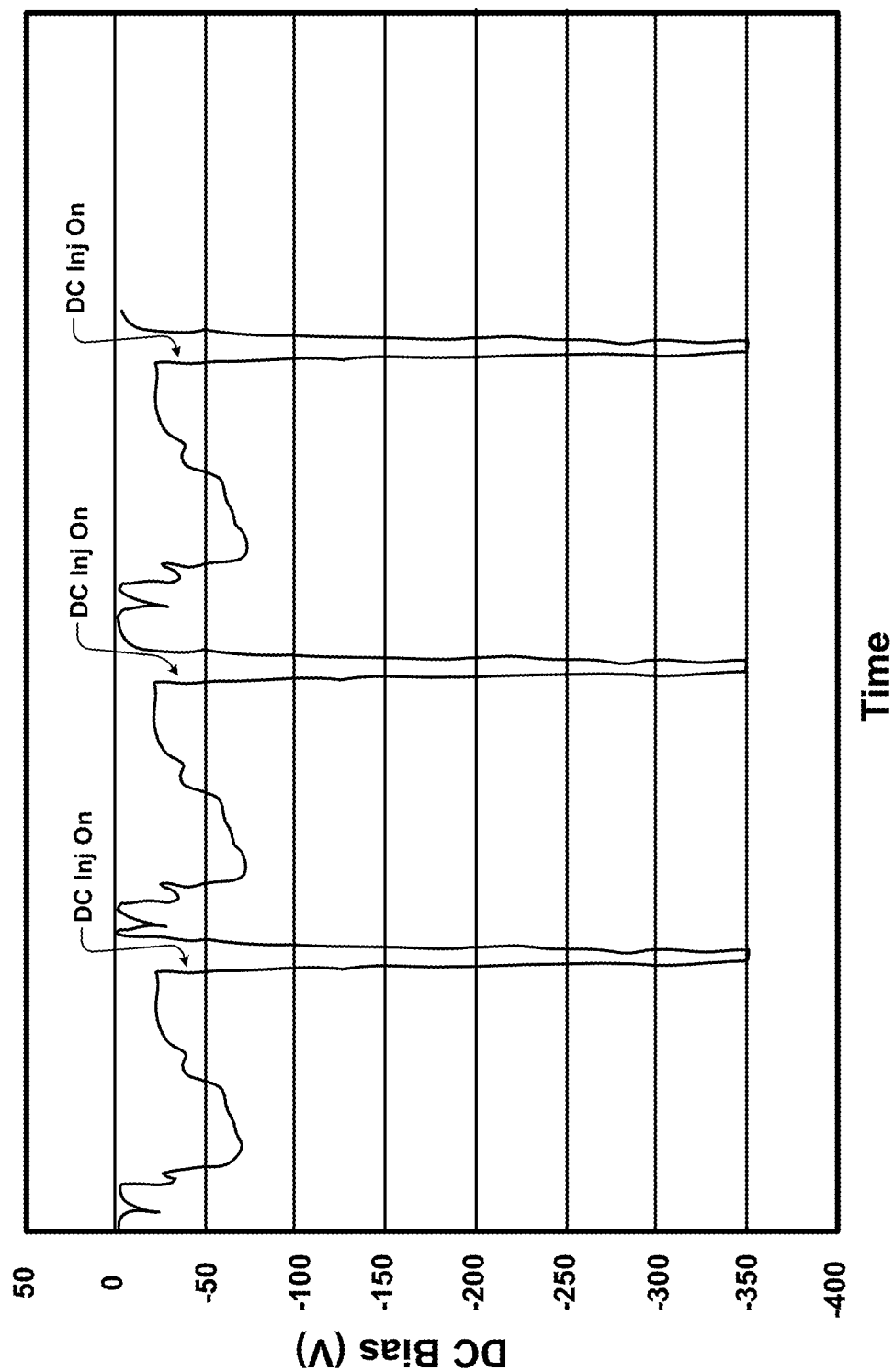
FIG. 9 is a graph illustrating DC bias voltage as a function of time for substrate processing systems depositing NFARL using carbon dioxide as the post deposition purge gas.
Figure 10A:
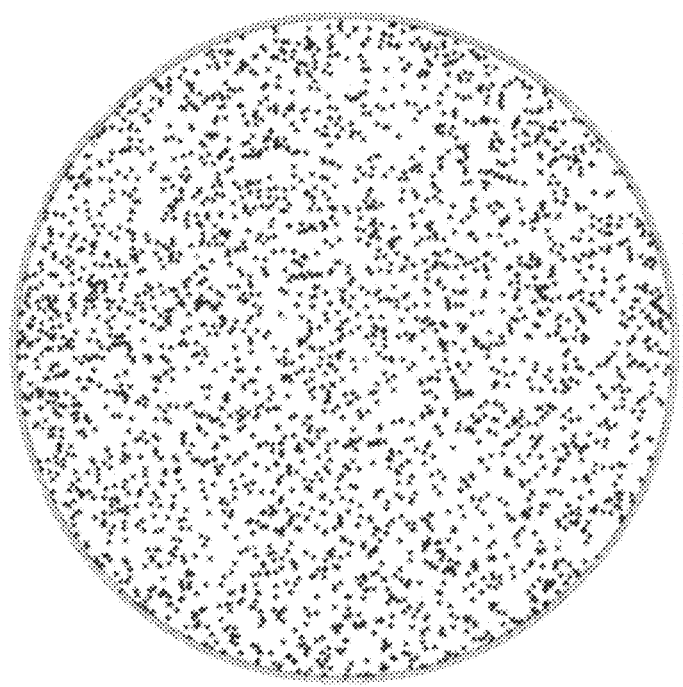
FIGS. 10A and 10B illustrate substrate defects after processes according to FIG. 8 and FIG. 9, respectively.
Figure 10B:
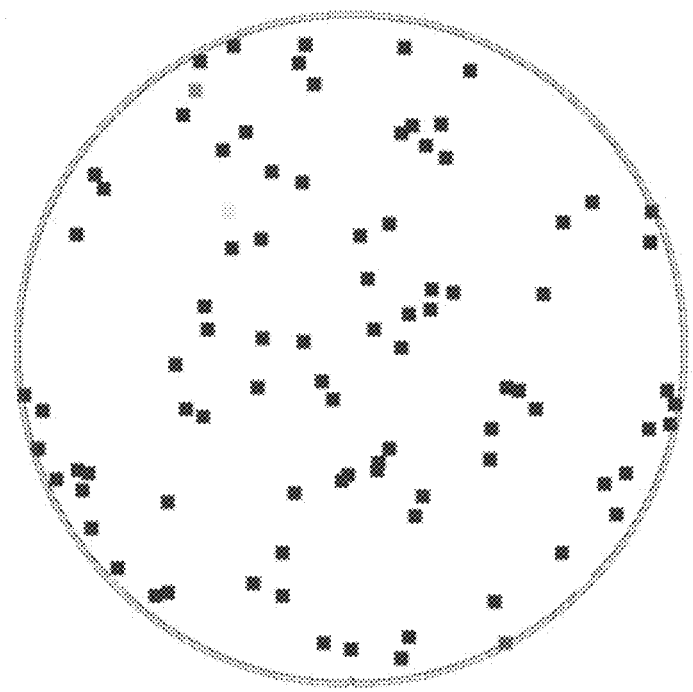

Referring now to FIGS. 9, 10A and 10B, improvement in the defect count can be obtained through selection of an appropriate post deposition purge gas such as a molecular reactant gas that is used while the DC bias voltage is applied to reduce particle count. For example, when using $CO_2$ instead of He in the NFARL process used in FIG. 8, the DC bias voltage is stable as shown in FIG. 9. In FIG. 10A, the NFARL film is shown using He as the post deposition purge gas. In FIG. 10B, the NFARL film is shown to have a significantly reduced defect count as compared to FIG. 10A when $CO_2$ is used.

The tests/simulations were repeated for post purge pressures (0.2 to 6 T) and gas flow rates (1 to 10 slm) with He and Ar. Under these conditions, DC bias voltage instability and the luminous plasma discharge were also observed. However when using $CO_2$ as the post deposition purge gas, the DC bias voltage was stable and plasma excitation by the DC bias voltage was not observed in the PECVD reactors.

Figure 11:
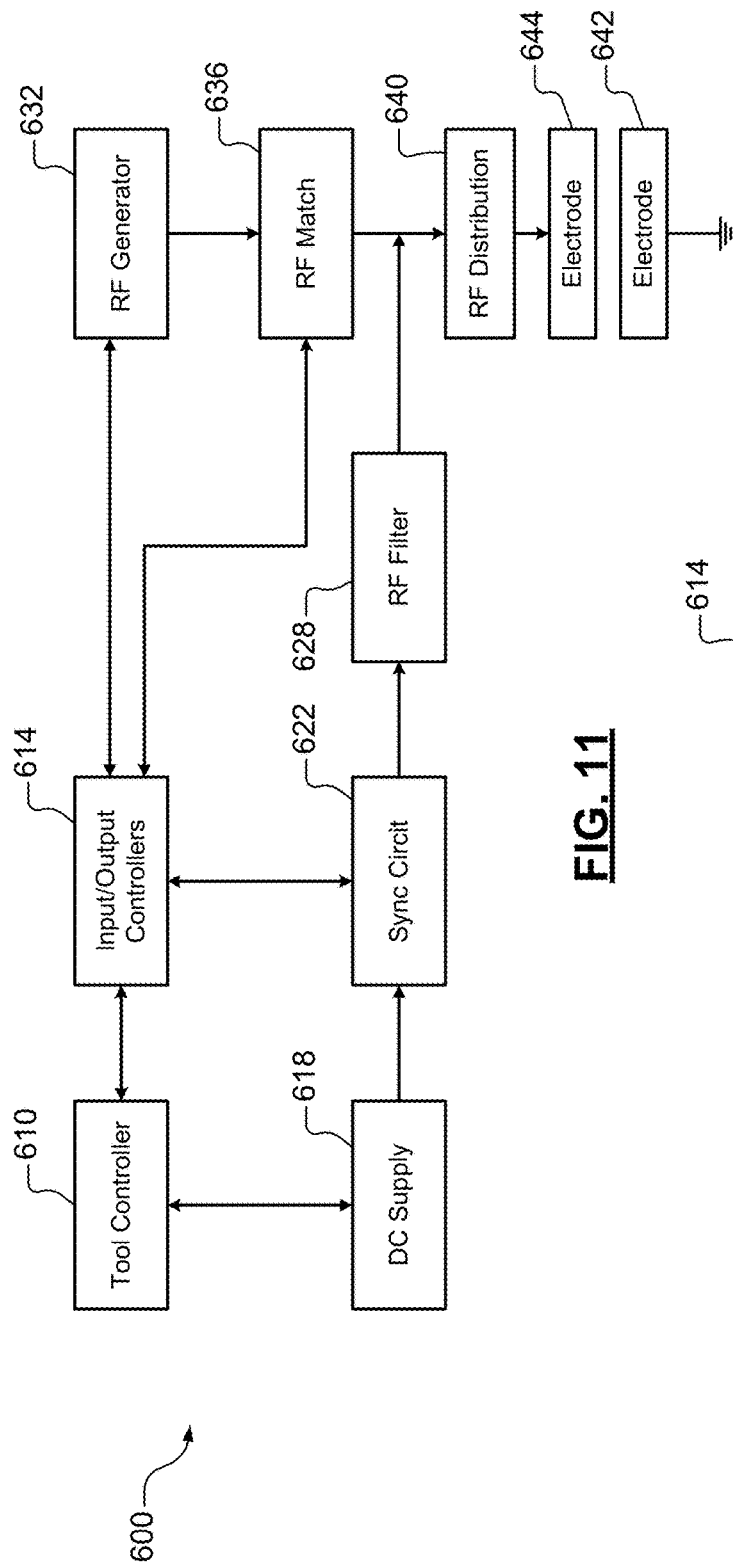
FIG. 11 is a functional block diagram of an alternative circuit arrangement for generating the DC bias signal.
Figure 12:
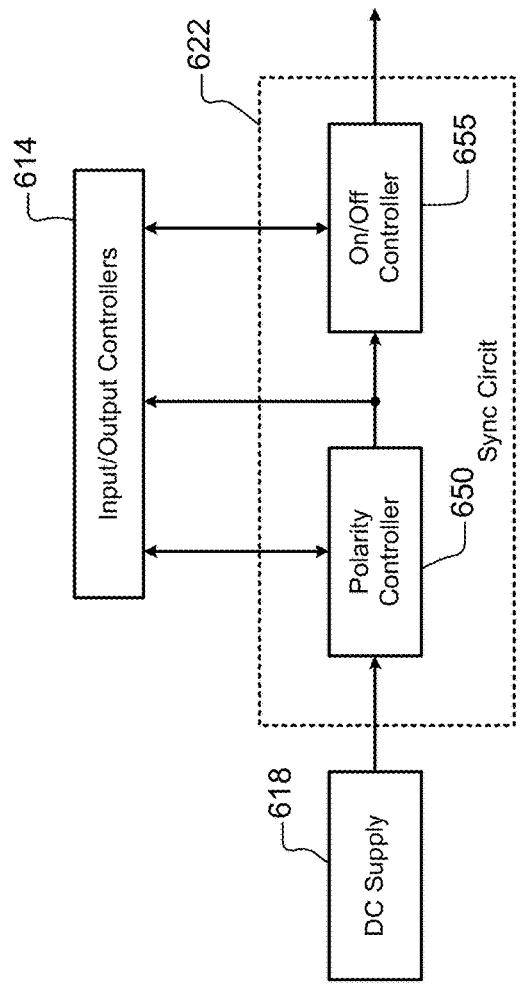
FIG. 12 is a functional block diagram of an alternative sync circuit.

Referring now to FIGS. 11-12, an example of a DC bias generating system is shown. In FIG. 11, an alternative circuit arrangement 600 for generating the DC bias signal is shown. A tool controller 610 sends a control signal to a DC supply 618 to supply a DC bias voltage. The tool controller 610 also sends control signals to an input/output controller 614, which controls a sync circuit 622, an RF generator 632 and an RF matching circuit 636. The output of the sync circuit 622 (the DC bias signal) is filtered by the RF filter 628, combined with an output of the RF matching circuit 636 and input to an RF distribution circuit 640. The RF distribution circuit 640 provides an output to electrodes 642 and 644 (such as, for example, a showerhead or electrode embedded in the pedestal). In FIG. 12, the sync circuit 622 may include a polarity controller 650 that controls a polarity of the DC bias signal and an on/off controller 655 that turns the DC bias on and off as needed based on control signals from the input/output controller 614.

While the foregoing description relates to NFARL film and various post deposition purge gases, other film types also benefit from the selection of a molecular reactant gas as the post deposition purge gas. For amorphous silicon (a-Si), He and $H_2$ are typically used as deposition carrier gases and molecular hydrogen ($H_2$) may be used as the post deposition purge gas. For ashable hardmask (AHM), He and $H_2$ are used as deposition carrier gases and $H_2$ is used as the post deposition gas. For silicon nitride (SiN), ammonia ($NH_3$) and molecular nitrogen ($N_2$) are used as deposition carrier gases and $N_2$ is used as the post deposition gas. For $SiO_2$, $N_2O$ and $N_2$ are used as deposition carrier gases and $N_2$ is used as the post deposition gas. For silicon oxycarbide (SiOC), $CO_2$ and He are used as deposition carrier gases and $CO_2$ is used as the post deposition gas.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A OR B OR C), using a non-exclusive logical OR, and should not be construed to mean "at least one of A, at least one of B, and at least one of C." It should be understood that one or more steps within a method may be executed in different order (or concurrently) without altering the principles of the present disclosure.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable end-point measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A method for processing a substrate in a substrate processing system, comprising:
    selectively delivering at least one of a precursor, a deposition carrier gas, and a post deposition purge gas to a processing chamber;
    depositing film on the substrate by generating radio frequency (RF) plasma in the processing chamber between an upper electrode and a lower electrode while supplying an RF voltage to one of the upper electrode and the lower electrode and while the precursor and the deposition carrier gas is delivered;
    selectively supplying a direct current (DC) bias voltage to the one of the upper electrode and the lower electrode;
    moving the substrate relative to a pedestal supporting the substrate while generating the DC bias voltage; and
    delivering the post deposition purge gas while supplying at least a portion of the DC bias voltage to the one of the upper electrode and the lower electrode.

2. The method of claim 1, wherein the post deposition purge gas includes a molecular reactant gas.

3. The method of claim 1, wherein the post deposition purge gas does not include an inert gas.

4. The method of claim 1, further comprising delivering a plurality of deposition carrier gases including the deposition carrier gas.

5. The method of claim 4, wherein the post deposition purge gas is selected from the plurality of deposition carrier gases.

6. The method of claim 1, wherein the post deposition purge gas has a higher breakdown voltage than helium and argon over process pressures from 0.2 Torr to 6 Torr.

7. The method of claim 1, wherein a start of the DC bias voltage is initiated a first predetermined period before the RF plasma is extinguished or a second predetermined period after the RF plasma is extinguished.

8. The method of claim 1, further comprising indexing substrates while the DC bias voltage is generated.

9. The method of claim 1, further comprising generating the DC bias voltage before the RF plasma is extinguished and ending the DC bias voltage before a subsequent RF plasma is struck.

10. The method of claim 1, further comprising generating the DC bias voltage continuously except during a period when the RF plasma is struck.

11. The method of claim 1, wherein the film is selected from a group consisting of nitrogen-free anti-reflective film, amorphous silicon, ashable hard mask, silicon nitride, silicon dioxide, and silicon oxycarbide.

12. The method of claim 1, wherein the deposition carrier gas is selected from a group consisting of carbon dioxide, helium, molecular hydrogen, molecular nitrogen, ammonia, and nitrous oxide.

13. The method of claim 1, wherein the post deposition purge gas is selected from a group consisting of carbon dioxide, molecular hydrogen, and molecular nitrogen.

* * * * *